United States Patent
Jing et al.

(10) Patent No.: US 12,142,464 B2
(45) Date of Patent: Nov. 12, 2024

(54) IN SITU REAL-TIME SENSING AND COMPENSATION OF NON-UNIFORMITIES IN SUBSTRATE PROCESSING SYSTEMS

(71) Applicant: LAM RESEARCH CORPORATION, Fremont, CA (US)

(72) Inventors: Changyou Jing, Livermore, CA (US); Benny Wu, Fremont, CA (US); Oleksandr Mikhnenko, San Diego, CA (US); Slobodan Mitrovic, Union City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 346 days.

(21) Appl. No.: 17/628,282

(22) PCT Filed: Jul. 21, 2020

(86) PCT No.: PCT/US2020/042843
§ 371 (c)(1),
(2) Date: Jan. 19, 2022

(87) PCT Pub. No.: WO2021/016223
PCT Pub. Date: Jan. 28, 2021

(65) Prior Publication Data
US 2022/0277928 A1    Sep. 1, 2022

Related U.S. Application Data

(60) Provisional application No. 62/878,548, filed on Jul. 25, 2019.

(51) Int. Cl.
*H01J 37/32* (2006.01)
*C23C 16/458* (2006.01)
(Continued)

(52) U.S. Cl.
CPC .... *H01J 37/32724* (2013.01); *C23C 16/4586* (2013.01); *H01J 37/32926* (2013.01);
(Continued)

(58) Field of Classification Search
CPC ............... H01J 37/32091; H01J 37/321; H01J 37/32174; H01J 37/32183;
(Continued)

(56) References Cited

U.S. PATENT DOCUMENTS 6,110,395 A * 8/2000 Gibson, Jr. ....... H01J 37/32522
427/571
9,324,589 B2 * 4/2016 Pease .................. H01L 21/6831
(Continued)

FOREIGN PATENT DOCUMENTS

CN    101582375 A    11/2009
CN    107039310 A    8/2017
(Continued)

OTHER PUBLICATIONS

Chinese Office Action and Search Report for Chinese Application No. 202080053761.7 dated Sep. 29, 2023.
(Continued)

*Primary Examiner* — Kurt Sweely

(57) ABSTRACT

Systems and methods of the disclosure perform in situ sensing and real time compensation of various non-uniformities in substrate processing systems. A plasma non-uniformity is sensed by determining a temperature distribution across a matrix of a plurality of micro-heaters disposed in the substrate support. Alternatively, the plasma non-uniformity is sensed by determining heat flux through the substrate support using the matrix heaters and one or more heaters used to heat one or more zones of the substrate support. The plasma non-uniformity is compensated by adjusting one or more parameters such as power supplied to the matrix (Continued)

heaters, RF power supplied to generate plasma, chemistry and/or flow rate of gas or gases used to generate plasma, settings of thermal control units or chillers, and so on. Additionally, non-uniformities inherent in the substrate support are sensed using the zone and matrix heaters and are compensated by adjusting the one or more parameters.

17 Claims, 10 Drawing Sheets

(51) Int. Cl.
*C23C 16/48* (2006.01)
*H01L 21/67* (2006.01)
*H01L 21/683* (2006.01)

(52) U.S. Cl.
CPC .. *H01J 37/32935* (2013.01); *H01L 21/67248* (2013.01); *C23C 16/481* (2013.01); *H01J 37/321* (2013.01); *H01J 37/3244* (2013.01); *H01J 37/32706* (2013.01); *H01L 21/67069* (2013.01); *H01L 21/6831* (2013.01)

(58) Field of Classification Search
CPC ........... H01J 37/32522; H01J 37/32532; H01J 37/32577; H01J 37/32697; H01J 37/32706; H01J 37/32715; H01J 37/32724; H01J 37/32917; H01J 37/32926; H01J 37/32935; H01J 37/3299; H01J 37/3244; C23C 16/4583; C23C 16/4584; C23C 16/4585; C23C 16/4586; C23C 16/481; C23C 16/505; C23C 16/507; C23C 16/509; C23C 16/4093; H01L 21/6831; H01L 21/6833; H01L 21/68785; H01L 21/67069; H01L 21/67248
See application file for complete search history.

(56) References Cited

U.S. PATENT DOCUMENTS

| | | |
|---|---|---|
| 2007/0089834 A1 | 4/2007 | Brillhart et al. |
| 2010/0159120 A1 | 6/2010 | Dzengeleski et al. |
| 2010/0243609 A1 | 9/2010 | Yamazawa et al. |
| 2012/0292305 A1* | 11/2012 | Ambal .................. G05D 23/22 219/520 |
| 2014/0346743 A1 | 11/2014 | Tavassoli et al. |
| 2015/0364354 A1 | 12/2015 | Tantiwong et al. |
| 2017/0047200 A1* | 2/2017 | Lee .................... H01J 37/32532 |
| 2017/0148657 A1* | 5/2017 | Pape .................. H01L 21/67103 |
| 2017/0372928 A1* | 12/2017 | Yamada ............... H05B 1/0233 |
| 2019/0013222 A1* | 1/2019 | Kim ................... H01J 37/32724 |
| 2019/0164852 A1* | 5/2019 | Peng .................. H01L 21/67253 |

FOREIGN PATENT DOCUMENTS

| | | |
|---|---|---|
| JP | 2010258428 A | 11/2010 |
| KR | 1020070043678 A | 4/2007 |

OTHER PUBLICATIONS

International Search Report and Written Opinion of the ISA issued in PCT/US2020/042843, mailed Nov. 5, 2020; ISA/KR.

* cited by examiner

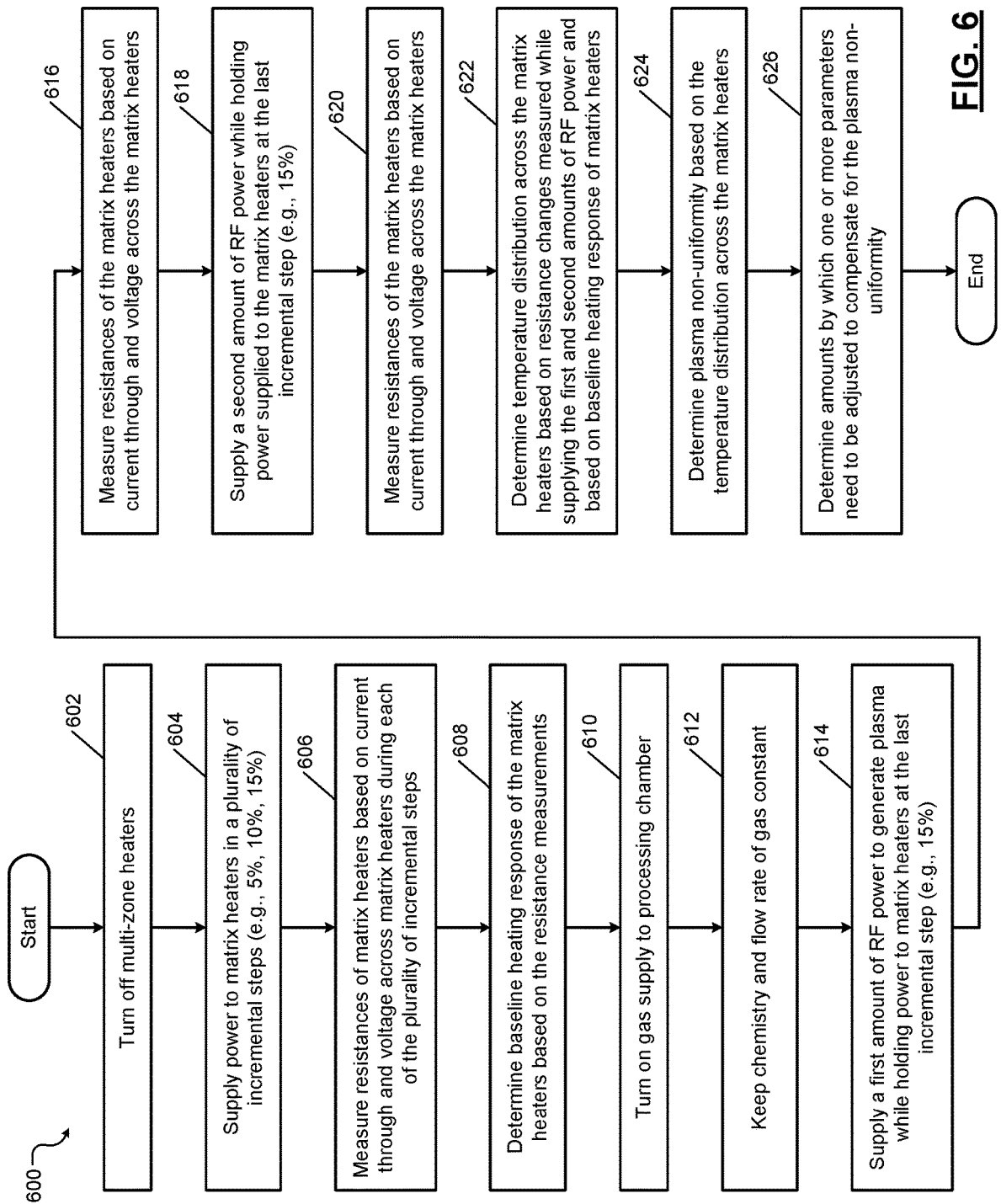

IN SITU REAL-TIME SENSING AND COMPENSATION OF NON-UNIFORMITIES IN SUBSTRATE PROCESSING SYSTEMS

CROSS-REFERENCE TO RELATED APPLICATIONS

This application is a U.S. National Phase Application under 35 U.S.C. 371 of International Application No. PCT/US2020/042843, filed on Jul. 21, 2020, which claims the benefit of U.S. Provisional Application No. 62/878,548 filed on Jul. 25, 2019. The entire disclosures of the applications referenced above are incorporated herein by reference.

FIELD

The present disclosure relates generally to substrate processing systems and more particularly to in situ sensing and real time compensation of various non-uniformities in the substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

A substrate processing system comprises a substrate support, a gas source, an RF generator, a power source, and a controller. The substrate support is configured to support a semiconductor substrate in a processing chamber. The substrate support comprises a matrix heater. The matrix heater includes a plurality of heater elements arranged in a matrix and is configured to control a temperature of the semiconductor substrate during processing. The gas source is configured to supply a process gas to the processing chamber. The RF generator is configured to supply RF power to the processing chamber to generate plasma in the processing chamber. The power source is configured to supply power to the plurality of heater elements of the matrix heater.

The controller is configured to perform the following operations while supplying a predetermined power to the plurality of heater elements of the matrix heater: supply the process gas and the RF power to generate the plasma; determine first resistances of the plurality of heater elements; vary one parameter selected from a group consisting of a chemistry of the process gas, a flow rate of the process gas, and the RF power to continue generating the plasma while keeping the other parameters from the group fixed; determine second resistances of the plurality of heater elements in response to varying the one parameter; and determine uniformity of the plasma based on the first and second resistances of the plurality of heater elements.

In other features, the controller is configured to perform the following operations prior to turning on the gas source and the RF generator: determine a heating response of the plurality of heater elements of the second heater by supplying power to the plurality of heater elements, increase the power to the plurality of heater elements in N increments up to the predetermined power, and determine resistances of the plurality of heater elements after each increment, where N is a positive integer. The controller is configured to, after determining the heating response of the plurality of heater elements of the second heater, determine the uniformity of the plasma based on the heating response and the first and second resistances of the plurality of heater elements.

In other features, the controller is configured to determine a temperature distribution across the plurality of heater elements based on the heating response and the first and second resistances of the plurality of heater elements. The controller is configured to determine the uniformity of the plasma based on the temperature distribution across the plurality of heater elements.

In other features, in response to the plasma being non-uniform, the controller is configured to adjust one or more of the following during the processing of the semiconductor substrate to compensate for the non-uniformity of the plasma: the RF power; the chemistry of the process gas; the flow rate of the process gas; the power supplied to one or more of the plurality of heater elements; a temperature of a coolant supplied by a thermal control unit to the substrate support; and a rate of flow of the coolant supplied by the thermal control unit to the substrate support.

In still other features, a substrate processing system comprises a substrate support, a gas source, an RF generator, and a controller. The substrate support is configured to support a semiconductor substrate in a processing chamber. The substrate support comprises a first heater and a second heater. The first heater is configured to heat a region of the substrate support adjacent to the semiconductor substrate during processing of the semiconductor substrate. The second heater is vertically separated from the first heater. The second heater comprises heater elements arranged in a matrix and is configured to control a temperature of the semiconductor substrate during processing. The gas source is configured to supply a process gas to the processing chamber. The RF generator is configured to supply RF power to the processing chamber to generate plasma in the processing chamber.

The controller is configured to supply the process gas and the RF power to generate the plasma; determine a first resistance of the first heater indicating a first temperature of the first heater; determine a second resistance of one of the heater elements of the second heater indicating a second temperature of the one of the heater elements; determine a heat flux between the first heater and the one of the heater elements based on a difference between the first and the second temperatures; and determine uniformity of the plasma based on the heat flux.

In other features, in response to the plasma being non-uniform, the controller is configured to adjust one or more of the following during the processing of the semiconductor substrate to compensate for the non-uniformity of the plasma: the RF power; a chemistry of the process gas; a flow rate of the process gas; a power supplied to one or more of the heater elements; a temperature of a coolant supplied by a thermal control unit to the substrate support; and a rate of flow of the coolant supplied by the thermal control unit to the substrate support.

In still other features, a substrate processing system comprises a substrate support, a power source, and a controller. The substrate support is configured to support a semiconductor substrate in a processing chamber. The substrate support comprises a first heater and a second heater. The first heater is configured to heat a region of the substrate support adjacent to the semiconductor substrate during processing of the semiconductor substrate. The second heater comprises heater elements arranged in a matrix and is configured to control a temperature of the semiconductor substrate during processing. The power source is configured to supply power to the first and second heaters.

The controller is configured to perform the following operations while supplying a predetermined power to the heater elements of the second heater: supply a first amount of power to the first heater; determine first resistances of the heater elements; supply a second amount of power to the first heater; determine second resistances of the heater elements; and determine a non-uniformity of the substrate support based on the first and second resistances of the heater elements.

In other features, the substrate processing system further comprises a gas source and an RF generator. The gas source is configured to supply a process gas to the processing chamber. The RF generator is configured to supply RF power to the processing chamber to generate plasma in the processing chamber. The controller is configured to turn off the gas source and the RF generator prior to supplying power to the first and second heaters until determining the non-uniformity of the substrate support.

In other features, the controller is configured to perform the following operations prior to supplying the first amount of power to the first heater: supply power to the heater elements of the second heater; increase the power to the heater elements in N increments up to the predetermined power, where N is a positive integer; determine resistances of the heater elements after each increment; and determine a heating response of the heater elements based on the resistances of the heater elements determined after each increment. The controller is configured to, after determining the heating response of the heater elements, determine the non-uniformity of the substrate support based on the heating response and the first and second resistances of the heater elements.

In other features, the controller is configured to determine a temperature distribution across the heater elements of the second heater based on the heating response and the first and second resistances of the heater elements. The controller is configured to determine the non-uniformity of the substrate support based on the temperature distribution across the heater elements.

In other features, the controller is configured to adjust one or more of the following during the processing of the semiconductor substrate to compensate for the non-uniformity of the substrate support: RF power supplied to generate plasma in the processing chamber; a chemistry of a process gas supplied to generate the plasma in the processing chamber; a flow rate of the process gas; the power supplied to one or more of the heater elements; a temperature of a coolant supplied by a thermal control unit to the substrate support; and a rate of flow of the coolant supplied by the thermal control unit to the substrate support.

In still other features, a system comprises a processor and a memory storing instructions which when executed by the processor configure the processor to turn off supply of a process gas and RF power to a processing chamber comprising a substrate support to support a semiconductor substrate. The instructions configure the processor to supply power to a plurality of heater elements arranged in a matrix in the substrate support to control a temperature of the semiconductor substrate during processing. The instructions configure the processor to increase the power to the heater elements in N increments up to a predetermined power, where N is a positive integer. The instructions configure the processor to determine resistances of the heater elements after each increment, and to determine a heating response of the heater elements based on the resistances.

The instructions further configure the processor to perform the following operations while supplying the predetermined power to the heater elements: supply the process gas and the RF power to generate plasma in the processing chamber; determine first resistances of the heater elements; vary one parameter selected from a group consisting of a chemistry of the process gas, a flow rate of the process gas, and the RF power to continue generating the plasma while keeping the other parameters from the group fixed; determine second resistances of the heater elements in response to varying the one parameter; determine a temperature distribution across the heater elements based on the heating response and the first and second resistances of the heater elements; and determine uniformity of the plasma based on the temperature distribution across the heater elements.

In other features, in response to the plasma being non-uniform, the instructions further configure the processor to adjust one or more of the following during the processing of the semiconductor substrate to compensate for the non-uniformity of the plasma: the RF power; the chemistry of the process gas; the flow rate of the process gas; the power supplied to one or more of the heater elements; a temperature of a coolant supplied by a thermal control unit to the substrate support; and a rate of flow of the coolant supplied by the thermal control unit to the substrate support.

In still other features, a system comprises a processor and a memory storing instructions which when executed by the processor configure the processor to supply a process gas and RF power to a processing chamber to generate plasma in the processing chamber. The processing chamber comprises a substrate support to support a semiconductor substrate during processing of the semiconductor substrate. The instructions configure the processor to determine a first resistance of a first heater arranged in the substrate support to heat a region of the substrate support adjacent to the semiconductor substrate during processing of the semiconductor substrate, the first resistance indicating a first temperature of the first heater. The instructions configure the processor to determine a second resistance of one of a plurality of heater elements arranged in a matrix in the substrate support to control a temperature of the semiconductor substrate during processing. The second resistance indicates a second temperature of the one of the heater elements. The instructions configure the processor to determine a heat flux between the first heater and the one of the heater elements based on a difference between the first and the second temperatures. The instructions configure the processor to determine uniformity of the plasma based on the heat flux.

In other features, in response to the plasma being non-uniform, the instructions further configure the processor to adjust one or more of the following during the processing of the semiconductor substrate to compensate for the non-uniformity of the plasma: the RF power; a chemistry of the process gas; a flow rate of the process gas; a power supplied to one or more of the heater elements; a temperature of a coolant supplied by a thermal control unit to the substrate support; and a rate of flow of the coolant supplied by the thermal control unit to the substrate support.

In still other features, a system comprises a processor and a memory storing instructions which when executed by the processor configure the processor to turn off power supply to a first heater arranged in a substrate support to heat a region of the substrate support adjacent to a semiconductor substrate arranged on the substrate support during processing of the semiconductor substrate in a processing chamber. The instructions configure the processor to turn off supply of a process gas and RF power to the processing chamber. The instructions configure the processor to supply power to a plurality of heater elements arranged in a matrix in the substrate support to control a temperature of the semiconductor substrate during processing. The instructions configure the processor to increase the power to the heater elements in N increments up to a predetermined power, where N is a positive integer. The instructions configure the processor to determine resistances of the heater elements after each increment, and to determine a heating response of the heater elements based on the resistances.

The instructions further configure the processor to perform the following operations while supplying the predetermined power to the heater elements: supply a first amount of power to the first heater; determine first resistances of the heater elements; supply a second amount of power to the first heater; determine second resistances of the heater elements; determine a temperature distribution across the heater elements based on the heating response and the first and second resistances of the heater elements; and determine the non-uniformity of the substrate support based on the temperature distribution across the heater elements.

In other features, the instructions further configure the processor to adjust one or more of the following during the processing of the semiconductor substrate to compensate for the non-uniformity of the substrate support: the RF power supplied to generate plasma in the processing chamber; a chemistry of the process gas supplied to generate the plasma in the processing chamber; a flow rate of the process gas; the power supplied to one or more of the heater elements; a temperature of a coolant supplied by a thermal control unit to the substrate support; and a rate of flow of the coolant supplied by the thermal control unit to the substrate support.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 shows a flowchart of a first method for sensing and compensating plasma non-uniformities;

In the drawings, reference numbers may be reused to identify similar and/or identical elements.

DETAILED DESCRIPTION

Figure 1:
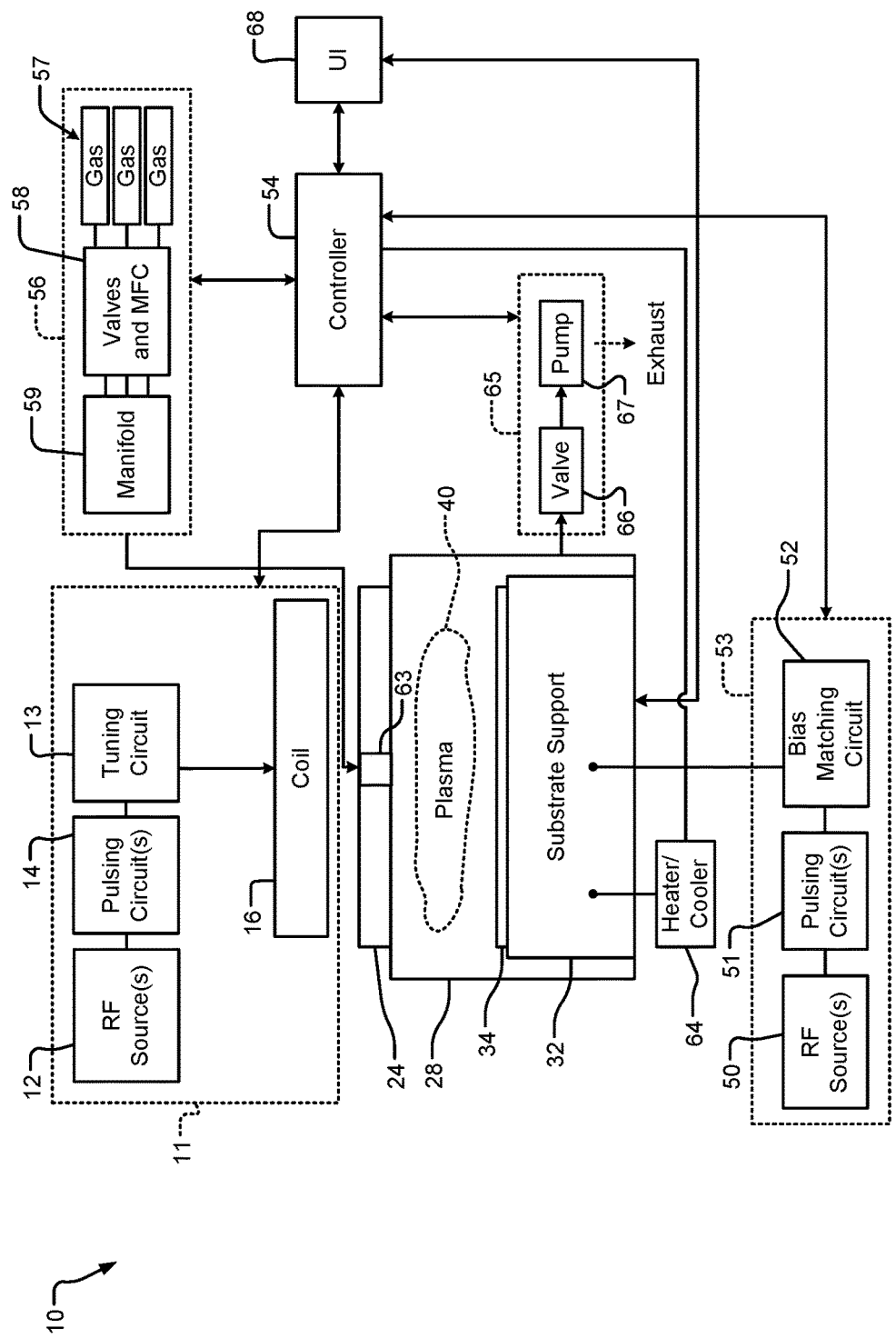
FIG. 1 shows a functional block diagram of a substrate processing system comprising a processing chamber that uses inductively coupled plasma to etch substrates such as semiconductor wafers.

The present disclosure relates to systems and methods for in situ sensing and real time compensation of various non-uniformities in substrate processing systems. For example, as explained below in detail, a plasma non-uniformity can be sensed by determining a temperature distribution across a matrix of a plurality of micro-heaters (hereinafter matrix heaters) disposed in the substrate support. Alternatively, the plasma non-uniformity can be sensed by determining heat flux through the substrate support using the matrix heaters and one or more heaters used to heat one or more zones of the substrate support (hereinafter multi-zone heaters). The plasma non-uniformity can be compensated by adjusting one or more parameters such as power supplied to the matrix heaters (hereinafter heater power), RF power supplied to generate plasma, chemistry and/or flow rate of gas or gases used to generate plasma, settings used for thermal control units (TCUs, also called chillers), and so on.

Additionally, non-uniformities inherent in the substrate support (hereinafter ESC non-uniformities) can be sensed using the multi-zone and matrix heaters and can be compensated by adjusting one or more parameters mentioned above. For example, the ESC non-uniformities may be present due to nonlinearities associated with the multi-zone heaters. Further, the ESC non-uniformities may be present due to various connections (e.g., wires) used to connect the heaters, electrodes (e.g., clamping electrodes), sensors (e.g., temperature sensors), etc. in the substrate support to control electronics and power supplies. As explained below, the systems and methods for sensing these non-uniformities are self-referencing and therefore obviate various complex calibration procedures typically used. The systems and methods, due to their self-referencing feature, provide chamber-to-chamber and wafer-to-wafer matching, which reduces variability and improves yield.

In general, process temperature uniformity is one of the key parameters that determines yield of working dies during semiconductor wafer processing in etch tools. There are multiple sources of non-uniformity in etch tools, including the following: the electrostatic Chuck (ESC), plasma-related non-uniformity, and wafer pattern. In the ESC, the non-uniformity can be due to the heaters, non-uniformity related to the heat flux through the ESC, and non-uniformity of the cooling system. Plasma can introduce significant non-uniformities, which is difficult to control and measure. Plasma non-uniformity can be due to RF non-uniformity and gas injection non-uniformity. Process wafer may have a specific pattern, which may translate into temperature non-uniformities by virtue of chemical reactions with process gasses. These reactions can be either exothermic or endothermic depending on the nature of chemical reactions between materials on wafer with gasses in chamber. Sensors at two different depths in the ESC can be used to calculate the heat flux through the ESC. Measuring the heat flux as opposed to the temperature has the advantage of being a differential measurement method, which is unaffected by local heat variations. The heat flux method provides a direct way of estimating plasma heat load. These and other features of the systems and methods are described below in detail.

The present disclosure is organized as follows. Before describing the systems and methods of the present disclosure, an example of a substrate processing system and a processing chamber where the systems and methods can be implemented is shown and described with reference to FIG. 1. The problems solved by the systems and methods of the present disclosure are described using a schematic representation of the processing chamber and other components of the substrate processing system shown in FIG. 2. Examples of heaters disposed in a substrate support are shown and described with reference to FIGS. 3A-5B. The solutions provided by the systems and methods of the present disclosure are described with reference to FIGS. 6-9B.

FIG. 1 shows an example of a substrate processing system 10 according to the present disclosure. The substrate processing system 10 includes a coil driving circuit 11. In some examples, the coil driving circuit 11 includes an RF source 12, a pulsing circuit 14, and a tuning circuit (i.e., matching circuit) 13. The pulsing circuit 14 controls a transformer coupled plasma (TCP) envelope of an RF signal generated by the RF source 12 and varies a duty cycle of TCP envelope between 1% and 99% during operation. As can be appreciated, the pulsing circuit 14 and the RF source 12 can be combined or separate.

The tuning circuit 13 may be directly connected to an inductive coil 16. While the substrate processing system 10 uses a single coil, some substrate processing systems may use a plurality of coils (e.g., inner and outer coils). The tuning circuit 13 tunes an output of the RF source 12 to a desired frequency and/or a desired phase, and matches an impedance of the coil 16.

A dielectric window 24 is arranged along a top side of a processing chamber 28. The processing chamber 28 further comprises a substrate support (or pedestal) 32 to support a substrate 34. The substrate support 32 may include an electrostatic chuck (ESC), or a mechanical chuck or other type of chuck. Process gas is supplied to the processing chamber 28 and plasma 40 is generated inside of the processing chamber 28. The plasma 40 etches an exposed surface of the substrate 34. An RF power supply 53 including an RF source 50, a pulsing circuit 51, and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas injector 63 may be arranged at a center of the dielectric window 24 and is used to inject gas mixtures from the gas delivery system 56 into the processing chamber 28. Additionally or alternatively, the gas mixtures may be injected from the side of the processing chamber 28.

A heater/cooler 64 may be used to heat/cool the substrate support 32 to a predetermined temperature. An exhaust system 65 includes a valve 66 and pump 67 to control pressure in the processing chamber and/or to remove reactants from the processing chamber 28 by purging or evacuation.

A controller 54 may be used to control the etching process. The controller 54 monitors system parameters and controls delivery of the gas mixture; striking, maintaining, and extinguishing the plasma; removal of reactants; supply of cooling fluid; controlling temperatures of heater/cooler 64; and so on. Additionally, as described below, the controller 54 may control various aspects of the coil driving circuit 11, the RF source 50, and the bias matching circuit 52, and so on.

A user interface (UI) 68 may interface with the controller 54 and the substrate support 32. The UI 68 can be used to monitor and control the processes performed in the processing chamber 28. For example, the UI 68 can receive data from sensors in the substrate support 32, set process parameters through the controller 54, and so on. UI can control temperature of the substrate 34 directly, or through the controller 54 indirectly.

Figure 2:
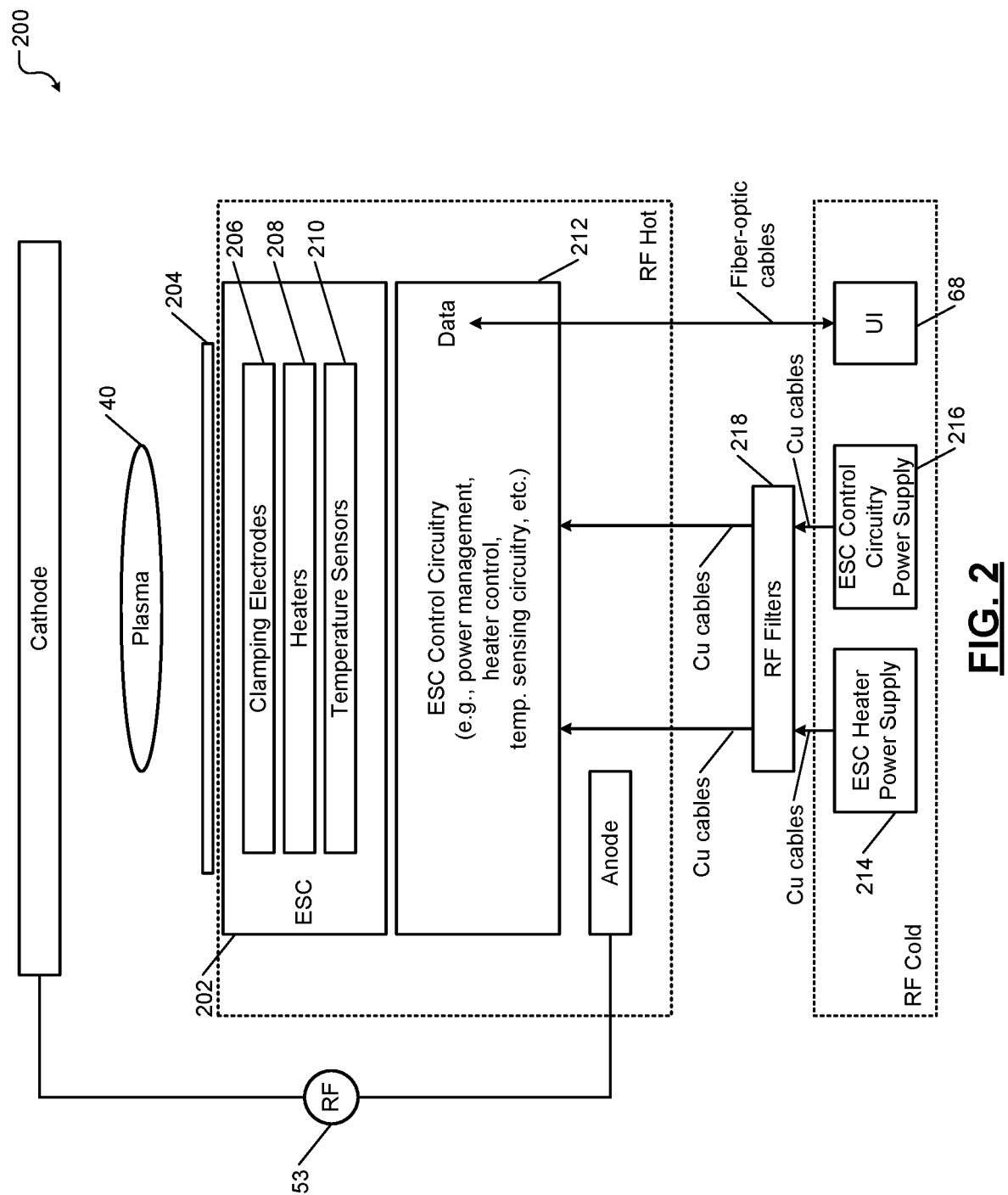
FIG. 2 shows a schematic representation of the processing chamber and other components of the substrate processing system of FIG. 1.

FIG. 2 shows a schematic representation of a processing chamber 200 (e.g., the processing chamber 28 of FIG. 1) and other components (e.g., power supplies and UI) of a substrate processing system (e.g., the system 10 of FIG. 1). For example, the processing chamber 200 comprises an ESC 202 that supports the substrate 204. The ESC 202 comprises one or more clamping electrodes 206, heaters 208, and one or more temperature sensors 210. For example, the heaters 208 include one or more multi-zone heaters and a plurality of the matrix heaters, each of which are individually controlled. Examples of the multi-zone and matrix heaters are shown and described with reference to FIGS. 3A-5B.

The processing chamber 200 further comprises control circuitry 212 for power management, heater control, and temperature sensing. A heater power supply 214 supplies power to the heaters 208 through RF filters 218 and the control circuitry 212. A power supply 216 supplies power to the control circuitry 212 through the RF filters 218. The power supplies 214, 216 use separate and often multiple RF filters. A user interface (e.g., the UI 68 of FIG. 1) interfaces with the control circuitry 212. The RF power supply 53 supplies RF power to generate plasma 40.

The RF plasma 40 is used for processing the substrate 204. To enable the processing, a so-called RF Hot environment or region is formed, where very high RF voltage (both in amplitude and frequency) is present during processing. The RF hot region includes assemblies such as an anode, the ESC 202, and the ESC control circuitry 212. Outside of the RF Hot region is a so-called RF Cold environment or region, where the RF voltage is relatively low compared to the RF Hot region during processing. The RF cold region includes assemblies such as system power supplies and controls (e.g., the power supplies 214 and 216, and the UI 68).

The power supplied by the power supplies 214, 216 is transmitted to the ESC 202 and the control circuitry 212 through copper cables. The UI 68 communicates with the control circuitry 212 through fiber-optic cables. Fiber-optic cables are generally used for data communication directly across the RF hot and RF cold regions because by nature light is immune to RF interference.

The voltage across the RF hot and RF cold regions can range typically from a few KV to tens of KV in amplitude, and from a few MHz to tens of MHz in frequency. Any copper cables that go across from the RF hot to RF cold regions are filtered by the RF filters 218 in order to block any RF pickups by the power supplies 214, 216.

Figure 3B:
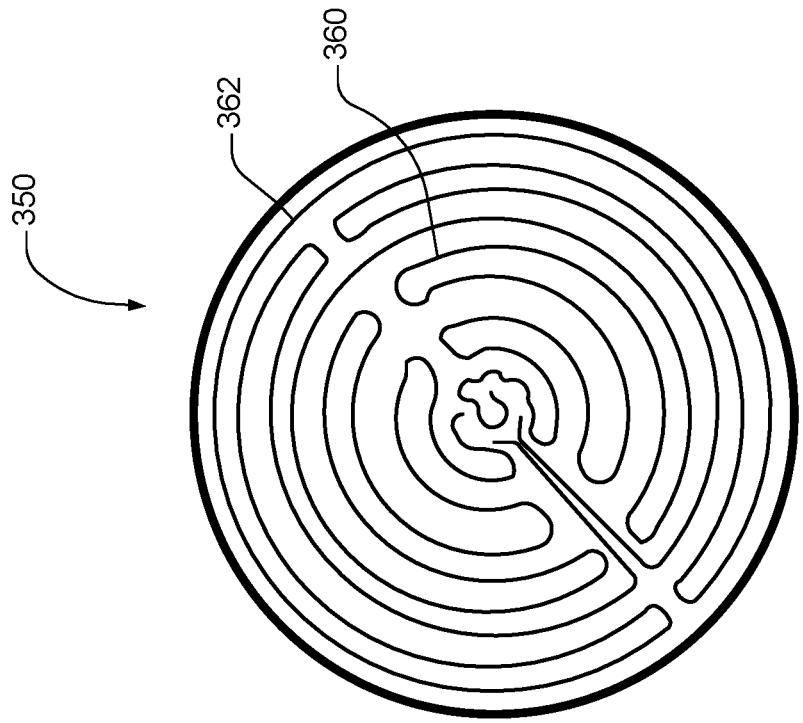
FIGS. 3A to 3C illustrate examples of pedestals including multiple heater zones.
Figure 3A:
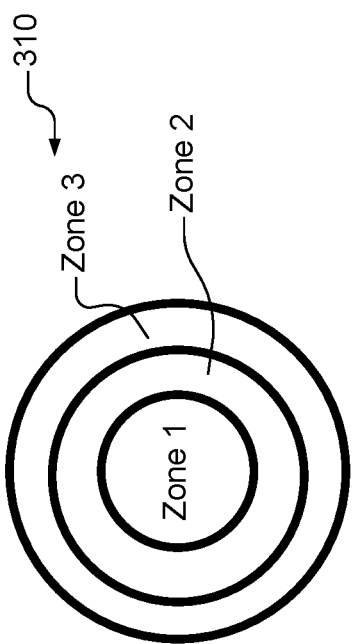
Figure 3C:
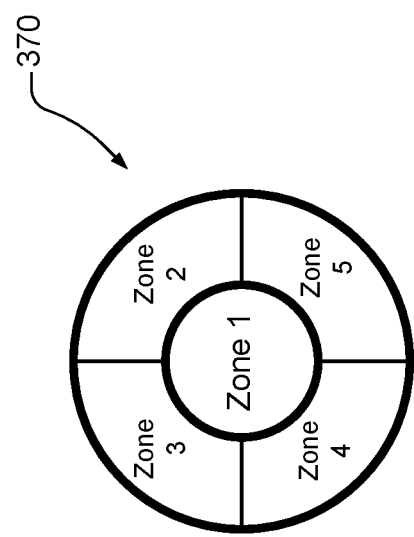

FIGS. 3A-3C show various examples of zones of a substrate support including multi-zone heaters are shown. While specific examples are shown, other zone layouts can be used. In FIG. 3A, a substrate support 310 (e.g., the ESC 202 of FIG. 2) includes concentric zones including zone 1, zone 2 and zone 3. Each of the zones includes a resistance heater (e.g., heaters 208 of FIG. 2). In FIG. 3B, a substrate support 350 (e.g., the ESC 202 of FIG. 2) includes resistive heater coils (e.g., heaters 208 of FIG. 2) defining an inner zone 360 and an outer zone 362. In FIG. 3C, in a substrate support 370, an inner zone 1 is surrounded by circumferential outer zones 2, 3, 4, and 5. Each of the zones includes a resistance heater (e.g., heaters 208 of FIG. 2). As can be appreciated, other zone layouts including respective resistance heaters can be used.

Figure 4B:
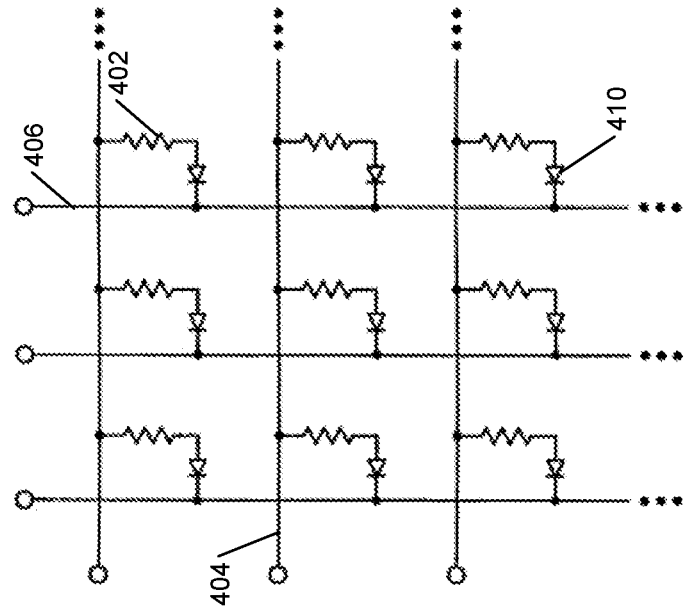
FIGS. 4A and 4B show examples of matrix heaters used in substrate supports.
Figure 4A:
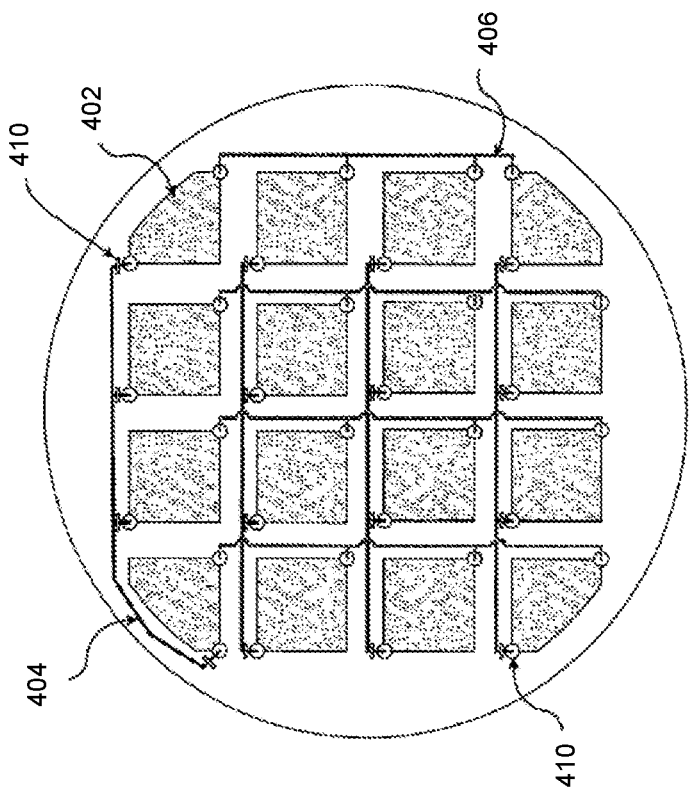

FIGS. 4A and 4B show examples of the matrix heaters. In FIG. 4A, a plurality of resistive heaters 402 (also called heater elements 402) are arranged in a matrix (i.e., in an array or a grid like arrangement) in a substrate support (e.g., the ESC 202 of FIG. 2) to form a matrix heater. Throughout the following discussion, the resistive heaters (i.e., the heater elements) 402 of a matrix heater are simply called matrix heaters 402 for readability and to easily distinguish them from the multi-zone heaters without having to recite—a heater element 402 of a matrix heater—at each instance. Accordingly, references to matrix heaters 402 below should be understood as heater elements 402 of a matrix heater, and references to a matrix heater 402 below should be understood as a heater element 402 of a matrix heater.

Each of the matrix heaters 402 can be independently controlled. Each of the matrix heaters 402 is connected to a power supply line 404 and a power return line 406. No two matrix heaters 402 share the same pair of power supply and power return lines 404, 406. By suitable electrical switching arrangements, a pair of power supply and power return lines 404, 406 is connected to a power supply (e.g., element 214 shown in FIG. 2). Thus, only one matrix heater 402 connected to one pair of power supply and power return lines 404, 406 is turned on at any given time. The time-averaged heating power of each matrix heater 402 can be individually tuned by time-domain multiplexing.

To prevent crosstalk between matrix heaters 402, a rectifier 410 (e.g., a diode) may be serially connected between each matrix heater 402 and the power supply lines 404 connected thereto (as shown in FIG. 4A) or between each matrix heater 402 and the power return lines 406 connected thereto (as shown in FIG. 4B). The rectifier 410 can be located in a heating plate comprising the matrix heaters 402 or in any other suitable location. Alternatively, any other current blocking arrangement such as solid state switches can be used to prevent crosstalk. Control circuitry (e.g., element 212 shown in FIG. 2) selects a pair of power supply and power return lines 404, 406 to operate one matrix heater 402 at a time.

Figure 5A:
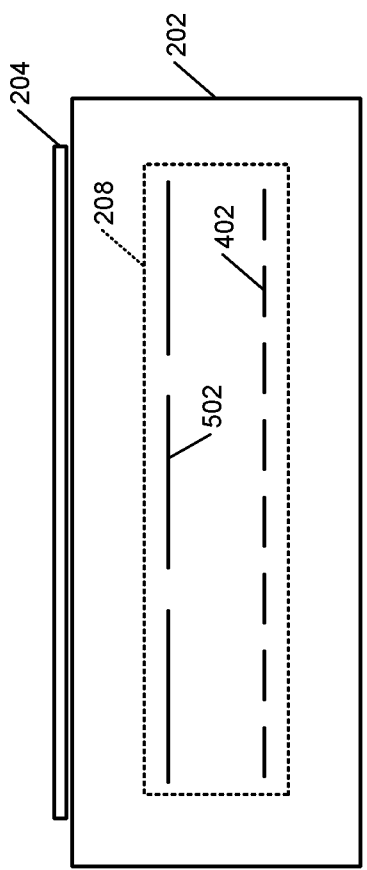
FIGS. 5A and 5B show two possible arrangements of the multi-zone and matrix heaters in a substrate support.
Figure 5B:
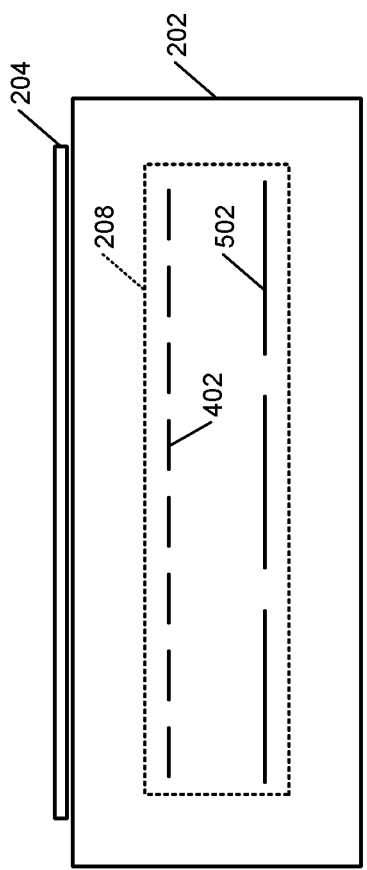

FIGS. 5A and 5B show two possible arrangements of the multi-zone and matrix heaters. In FIG. 5A, one or more multi-zone heaters 502 are arranged in the substrate support (e.g., the ESC 202) along a first plane parallel to the substrate 204. The first plane is at a first distance from a top surface of the substrate support on which substrate 204 is arranged during processing. The plurality of matrix heaters 402 are arranged in a second plane parallel to the substrate 204. The second plane is at a second distance from the top surface of the substrate support on which substrate 204 is arranged during processing. In other words, the multi-zone heaters 502 are closer to the top surface of the substrate support than the matrix heaters 402.

FIG. 5B shows an arrangement where the positions of the multi-zone heaters 502 and the matrix heaters 402 are reversed. The multi-zone heaters 502 and the matrix heaters 402 are collectively referred to as the heaters 208. Either arrangement of the heaters 208 is suitable for sensing and compensating the non-uniformities according the present disclosure as described below.

In substrate processing systems (e.g., element 10 shown in FIG. 1), plasma etch uniformity (or RF and process gas uniformity) is a critical parameter for wafer processing. Presently, plasma uniformity measurements are available, but few are available in-situ and in real-time. For example, a Langmuir probe can be used to measure the plasma uniformity, but this is seldom done except during product development (i.e., not during production). In production, in-line inspections of the process results (such as critical dimension, etch rate, and etch uniformity) are used to assess overall process chamber uniformity (i.e., a combination of plasma uniformity and temperature uniformity) and to provide feedback for tuning. Alternatively, a temperature wafer can be used as a proxy for plasma uniformity.

These existing methods of measuring plasma uniformity have disadvantages. For example, in-line inspection feedback is not real-time. Yield loss can be experienced if conditions shift between inspections points. Langmuir probes have insufficient resolution, and are not suitable for production environments. Temperature wafers are expensive, and may not be suitable for certain plasma chemistries. Similar to the Langmuir probes, the temperature wafers don't provide real-time feedbacks during wafer processing.

The present disclosure proposes using the heaters within the substrate support (e.g., the ESC) to sense plasma and other non-uniformities. Plasma heats up the heaters in the ESC. A heater's resistance changes with temperature (due to Temperature Coefficient of Resistivity, or TCR effect). The resistance change rate is linear with the temperature change. Uniform plasma is expected to result in uniform heating of the matrix heaters, and hence uniform resistance change rate of the matrix heaters. Any plasma non-uniformities can cause non-uniform heating of the matrix heaters, which in turn can cause non-uniform resistance change rates in the matrix heaters. Accordingly, the effect of plasma heating on the matrix heaters can be measured by measuring the matrix heaters' resistances. The matrix heaters' resistance measurements are used for spatial temperature measurement. The spatial temperature measurement is used for approximation of plasma uniformity. Thus, the plasma heating effect can be analyzed spatially, and the plasma induced temperature change, or a proxy of plasma uniformity can be deduced.

The systems and methods of the present disclosure provide many benefits. For example, since the matrix heater's current measurement is available, it can be easily used for resistance measurement, and plasma uniformity can be measured therefrom without any additional hardware or equipment. Further, plasma uniformity can be measured in situ and close to the wafer location. That is, from the wafer's point view, the plasma uniformity measurement is more direct. Furthermore, the plasma uniformity measurement is made in real time. As explained below, plasma non-uniformity induced by RF power, gas chemistry, or other variables can be handled by the same method. Additionally, close-loop real-time compensation for plasma non-uniformity can be performed, which enables chamber-to-chamber and wafer-to-wafer matching to reduce variability and improve yield.

The plasma non-uniformity can be sensed by determining temperature distribution across the matrix heaters 402 or by determining heat flux through the ESC (e.g., the ESC 202). Any non-uniformity sensed in the plasma is sensed and used as feedback to adjust one or more parameters as described below with reference to FIGS. 6-7B. To determine the plasma non-uniformity using the temperature distribution method shown in FIG. 6, only the matrix heaters 402 are used; the multi-zone heaters 502 are not used. To determine the plasma non-uniformity using the heat flux method shown in FIGS. 7A and 7B, both the matrix heaters 402 and the multi-zone heaters 502 are used. Non-uniformities inherently present in the ESC are also determined using both the matrix heaters 402 and the multi-zone heaters 502 as explained below with reference to FIG. 8.

FIG. 6 shows an example of a method 600 for sensing and compensating plasma non-uniformities. The method 600 uses temperature distribution across the matrix heaters to determine plasma non-uniformity. For example, the method 600 is performed by the controller 900 shown in FIGS. 9A and 9B described below. At 602, the method 600 turns off the multi-zone heaters. Additionally, gas supply and RF power to the processing chamber are also turned off (i.e., no plasma is generated).

At 604, the method 600 supplies power to the matrix heaters in a plurality of incremental steps. For example, in a first step, the method 600 supplies 5% of the total power to the matrix heaters; in a second step, the method 600 supplies 10% of the total power to the matrix heaters; and so on. The amount of increment need not be by 5%; any other percentage amount can be used instead.

At 606, the method 600 measures the resistances of the matrix heaters after every step mentioned in 604. After every step, the method 600 measures the resistances for the matrix heaters based on sensing current through the matrix heaters and voltages across the matrix heaters. At 608, based on the resistance measurements made in the plurality of steps mentioned in 604 and 606, the method 600 determines a baseline heating response of the matrix heaters in the absence of the plasma.

At 610, the method 600 turns on the gas supply to the processing chamber. At 612, the method 600 keeps the chemistry and the flow rate of the gas constant. At 614, the method 600 supplies a first amount of RF power to generate plasma in the processing chamber while holding the power to the matrix heaters at the last incremental step in 604 (e.g., 15%). At 616, the method 600 measures the resistances of the matrix heaters by sensing current through the matrix heaters and voltages across the matrix heaters. At 618, the method 600 supplies a second amount of RF power while holding the power to the matrix heaters at the last incremental step in 604 (e.g., 15%). For example, the second amount may be greater than the first amount. At 620, the method 600 measures the resistances of the matrix heaters by sensing current through the matrix heaters and voltages across the matrix heaters.

At 622, the method 600 determines a temperature distribution across the matrix heaters based on the changes in resistance (i.e., ΔR, rather than actual resistance values) measured while supplying the first and second amounts of RF power and based on the heating response of the matrix heaters determined at 608. At 624, the method 600 determines plasma non-uniformity based on the temperature distribution across the matrix heaters. At 626, the method 600 determines an amount or amounts by which one or more parameters of the substrate processing system need to be adjusted to compensate for the plasma non-uniformity.

For example, the method 600 may adjust one or more of the RF power, the power supplied to the multi-zone and/or matrix heaters, the chemistry and/or the flow rate of the gas used to generate the plasma, and settings of the TCU (chiller) (e.g., element 64 shown in FIG. 1). For example, the settings of the TCU include a temperature and/or a flow rate of the coolant circulated by the TCU through the cooling channels (e.g., element 220 shown in FIG. 7A) in the ESC. This way, a uniform temperature can be maintained across the substrate according to a temperature profile determined for the recipe used to the process the substrate.

In the method 600, the RF power is changed for example only. In some implementations, the RF power may be constant, and one or more of the chemistry and/or the flow rate of the gas used to generate the plasma maybe changed instead at 614 and 618. Likewise any other variable or parameter used to generate the plasma maybe changed.

Further, in the method 600, the number of incremental steps at 604 may include a plurality of steps. Furthermore, the number of times the RF power (or any other factor affecting generation of plasma) is changed can be greater than two. The resolution of measuring the temperature distribution and the resolution of measuring the plasma uniformity can be increased by increasing the number of incremental steps at 604 and/or the number of times the factor affecting plasma generation is changed.

Figure 7A:
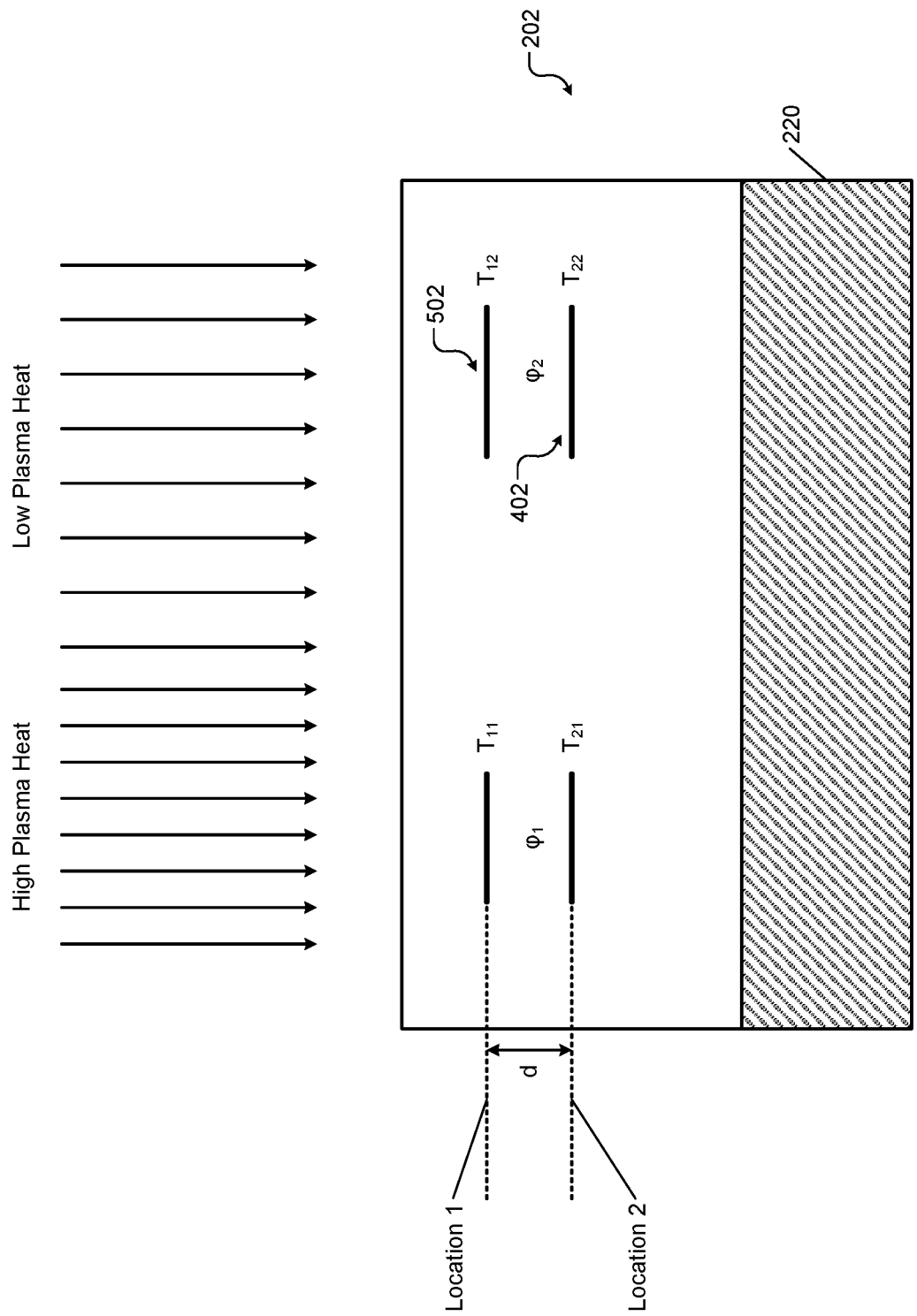
FIGS. 7A and 7B show a flowchart of a second method for sensing and compensating plasma non-uniformities.
Figure 7B:
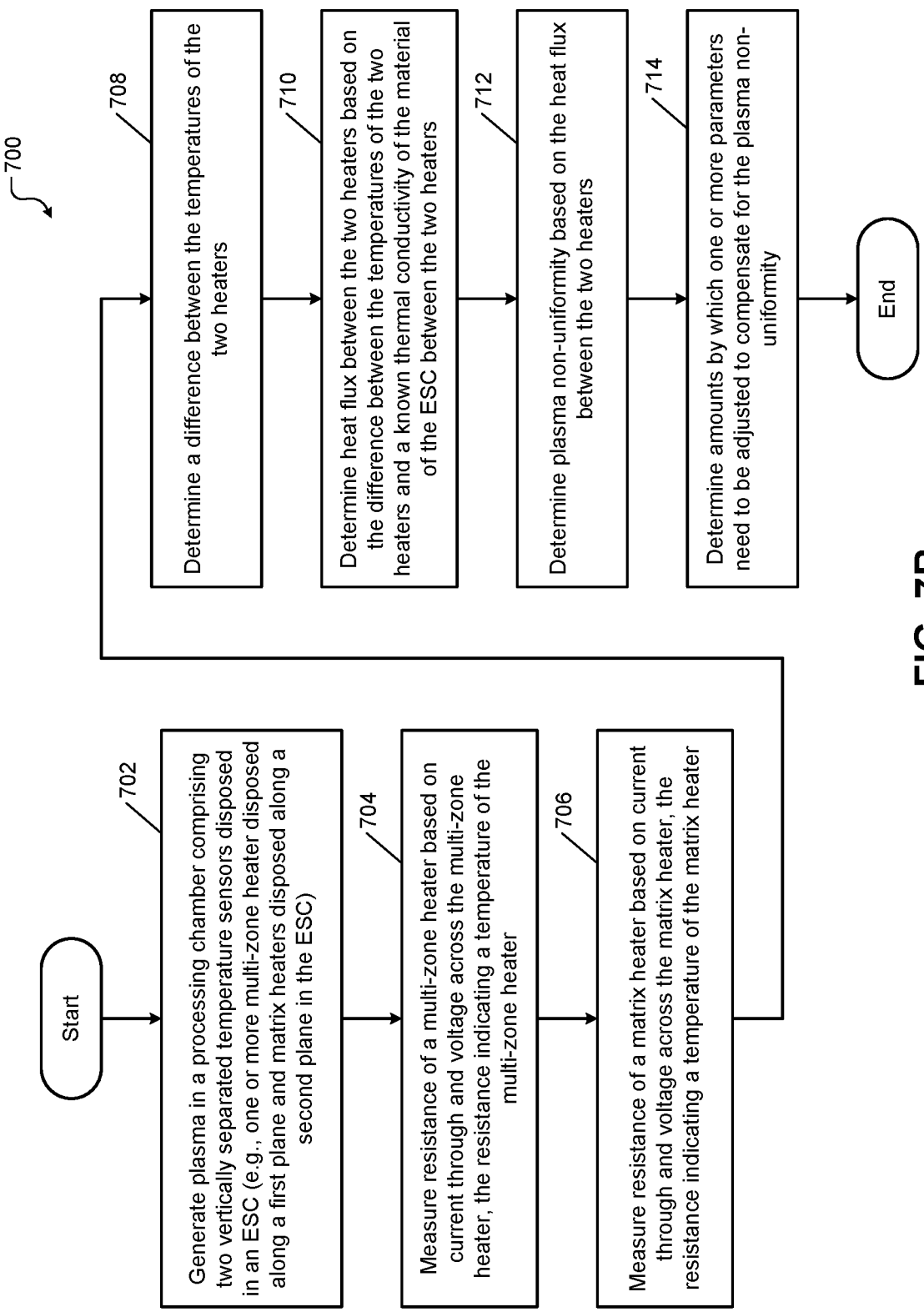

FIGS. 7A and 7B show a system and a method for sensing the heat flux in the ESC 202 using both the matrix heaters 402 and the multi-zone heaters 502 and compensating plasma non-uniformities based on the heat flux. FIG. 7A shows the system comprising two sensors (e.g., the matrix heaters 402 and the multi-zone heaters 502) disposed at two different depths in the ESC 202. For example, a first sensor (e.g., the multi-zone heaters 502) is located closer to the top surface of the ESC 202; and a second sensor (e.g., the matrix heaters 402) is located farther (i.e., deeper) from the top surface of the ESC 202.

During wafer processing, the plasma incident on the top surface of the ESC 202 is an energy source while the ESC 202 is an energy sink. The ESC 202 is an energy sink due to the cooling channels 220 disposed in the base plate of the ESC 202 through which the TCU (e.g., element 64 shown in FIG. 1) flows a coolant to withdraw heat from the ESC 202. The two sensors, one disposed closer to the energy source and the other disposed closer to the energy sink, can be used to calculate the heat flux through the ESC 202. Measuring the heat flux as opposed to the temperature has the advantage of being a differential measurement, which is unaffected by local heat variations.

This method provides a direct way of estimating plasma heat load. For example, suppose that the two sensors are at locations 1 and 2 as shown in FIG. 7A. The heat flowing through these locations is expressed in terms of heat flux as follows:

$$\Phi_1 = -k\frac{T_{21} - T_{11}}{d}$$

$$\Phi_2 = -k\frac{T_{22} - T_{12}}{d}$$

where k is the known thermal conductivity of the material of the ESC in which the two sensors are disposed, and d is the vertical distance that separates the two sensors within the ESC. In this example, $\Phi_1$ will have larger absolute value than $\Phi_2$, which reflects a higher heat load at location 1 than at location 2.

Heat flux at a given location within the ESC is a parameter of interest in substrate processing. The two sensors that are separated by a material of known thermal conductivity can be used to determine an amount power delivered by the plasma at a particular location within the ESC and to provide a spatial resolution to the delivered power.

Specifically, the first sensor (e.g., the multi-zone heaters 502) can provide a first temperature at the first location in the ESC (e.g., closer to the top surface of the ESC). The second sensor (e.g., the matrix heaters 402) can provide a second temperature at the second location in the ESC that is farther (i.e., deeper) than the top surface of the ESC. Knowing the delta (i.e. the difference) between these two temperatures between the two locations and knowing the thermal conductivity of the material between the two locations of the two sensors, the heat flux between the two locations can be calculated. The heat flux can be used for various purposes including chamber optimization and non-uniformity compensation.

The heat flux based method is based on energy flux which is a vector quantity. In contrast, the method 600 is based on temperature, which is a scalar quantity. Being based on a differential measurement, the heat flux based method is immune to (i.e., unaffected by) various non-uniformities that are inherently present in the ESC.

FIG. 7B shows a method 700 for sensing heat flux in an ESC and compensating plasma non-uniformities using the heat flux in the ESC. The method 700 uses heat flux through the ESC to determine plasma non-uniformity. For example, the method 700 is performed by the controller 900 shown in FIGS. 9A and 9B described below. At 702, the method 700 generates plasma in a processing chamber comprising two temperature sensors disposed in a substrate support (e.g., the ESC) of the processing chamber. For example, a first temperature sensor may include one or more multi-zone heaters disposed along a first plane in the ESC, and the second temperature sensor may include one or more matrix heaters disposed along a second plane in the ESC. The first plane and the second plane are parallel to each other and parallel to the top surface of the ESC on which a substrate may be arranged during processing.

The two temperature sensors are arranged at different depths within the ESC. For example, the multi-zone heater may be closer to the top surface of the ESC, and the matrix heater may be farther or deeper from the top surface of the ESC. For example, as shown in FIG. 7A, the two heaters (i.e., two temperature sensors) are separated by a distance d along an axis perpendicular to the planes in which the two temperature sensors lie. During substrate processing, when plasma is incident on the top surface of the ESC, the top or upper heater (e.g., the multi-zone heater) absorbs more energy from the plasma and heats up to a higher temperature than the bottom or lower heater (e.g., the matrix heater).

At 704, the method 700 measures a first resistance of the first temperature sensor by measuring current through and voltage across the first temperature sensor. The first resistance is representative of a first temperature of the first temperature sensor. At 706, the method 700 measures a second resistance of the second temperature sensor by measuring current through and voltage across the second temperature sensor. The second resistance is representative of a second temperature of the second temperature sensor.

At 708, the method 700 determines a difference between the first and second temperatures of the first and second temperature sensors. At 710, the method 700 determines a heat flux between the two temperature sensors based on the difference between the first and second temperatures of the first and second temperature sensors and based on a known thermal conductivity of the material of the ESC between the two temperature sensors.

At 712, the method 700 determines plasma non-uniformity based on the heat flux between the two temperature sensors. At 714, the method 700 determines an amount or amounts by which one or more parameters of the substrate processing system need to be adjusted to compensate for the plasma non-uniformity.

For example, the method 700 may adjust one or more of the RF power used to generate the plasma, the power supplied to the multi-zone and/or matrix heaters, the chemistry and/or the flow rate of the gas used to generate the plasma, and settings for the TCU (chiller) (e.g., element 64 shown in FIG. 1). For example, the settings of the TCU include a temperature and/or a flow rate of the coolant circulated by the TCU through the cooling channels (e.g., element 220 shown in FIG. 7A) in the ESC. This way, a uniform temperature can be maintained across the substrate according to a temperature profile determined for the recipe used to process the substrate.

Figure 8:
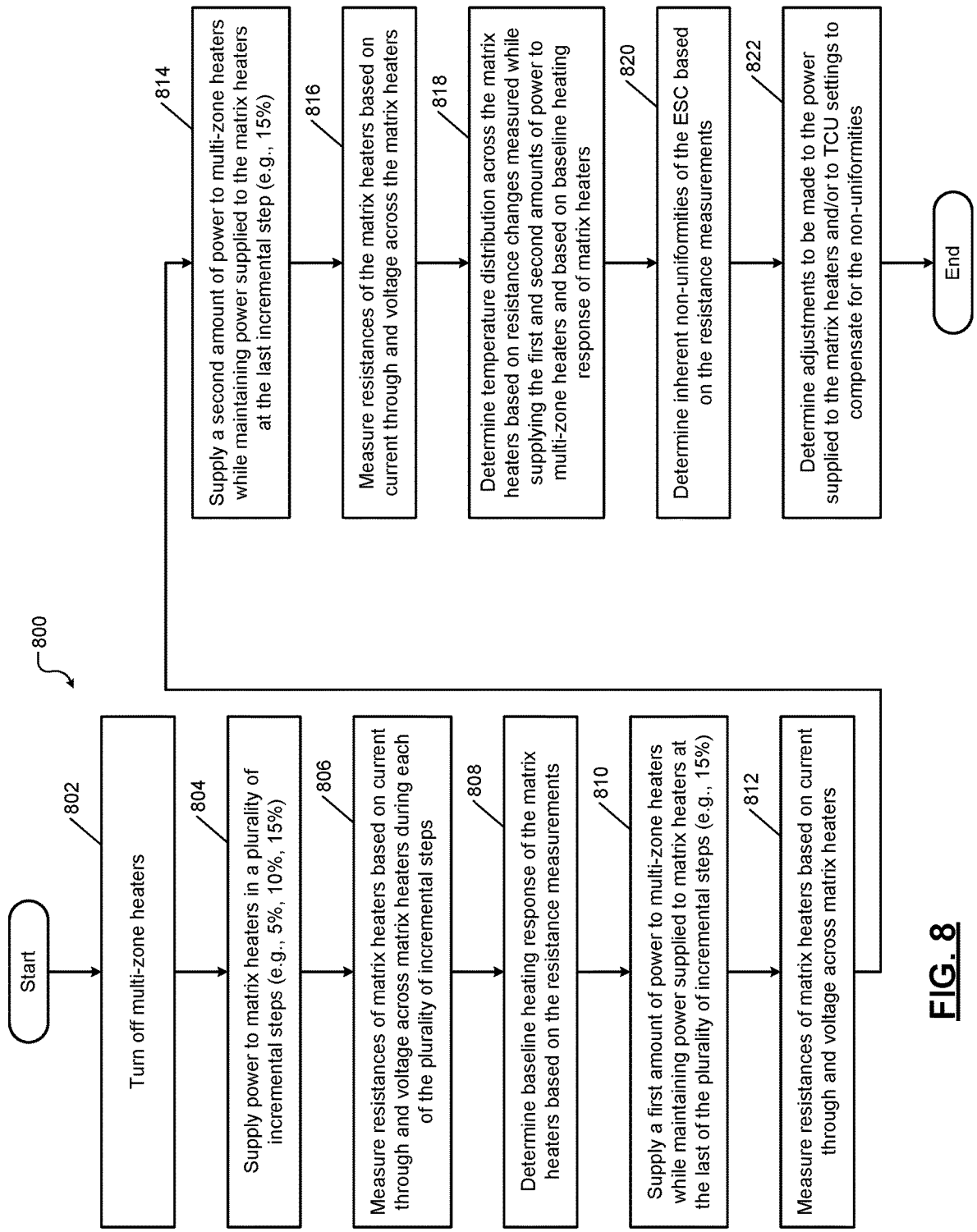
FIG. 8 shows a flowchart of a third method of sensing and compensating non-uniform ities that are inherently present in a substrate support.

FIG. 8 shows an example of a method 800 for sensing and compensating ESC non-uniformities. The method 800 uses both the matrix heaters 402 and the multi-zone heaters 502 to sense the non-uniformities inherently present in the ESC. Plasma is not generated throughout the method 800. At 802, the method 800 turns off the multi-zone heaters. Additionally, gas supply and RF power to the processing chamber are also turned off (i.e., no plasma is generated).

At 804, the method 800 supplies power to the matrix heaters in a plurality of incremental steps. For example, in a first step, the method 800 supplies 5% of the total power to the matrix heaters; in a second step, the method 800 supplies 10% of the total power to the matrix heaters; and so on. The amount of increment need not be by 5%; any other percentage amount can be used instead.

At 806, the method 800 measures the resistances of the matrix heaters after every step mentioned in 804. After every step, the method 800 measures the resistances for the matrix heaters based on sensing current through the matrix heaters and voltages across the matrix heaters. At 808, based on the resistance measurements made in the plurality of steps mentioned in 804 and 806, the method 800 determines a baseline heating response of the matrix heaters.

At 810, the method 800 supplies a first amount of power to the multi-zone heaters while holding the power supply to the matrix heaters at the last incremental step in 804 (e.g., 15%). At 812, the method 800 measures the resistances of the matrix heaters by sensing current through the matrix heaters and voltages across the matrix heaters. At 814, the method 800 supplies a second amount of power to the multi-zone heaters while holding the power supply to the matrix heaters at the last incremental step in 604 (e.g., 15%). For example, the second amount may be greater than the first amount. At 816, the method 800 measures the resistances of the matrix heaters by sensing current through the matrix heaters and voltages across the matrix heaters.

At 818, the method 800 determines a temperature distribution across the matrix heaters based on the changes in resistance (i.e., $\Delta R$, rather than actual resistance values)

measured while supplying the first and second amounts of power to the multi-zone heaters and based on the heating response of the matrix heaters determined at 808. At 820, the method 800 determines ESC non-uniformity based on the temperature distribution across the matrix heaters. At 822, the method 800 determines an amount or amounts by which one or more parameters of the substrate processing system need to be adjusted to compensate for the ESC non-uniformity.

For example, the method 800 may adjust one or more of the power supplied to the multi-zone and/or matrix heaters and settings for the TCU (chiller). For example, the settings of the TCU include a temperature and/or a flow rate of the coolant circulated by the TCU through the cooling channels (e.g., element 220 shown in FIG. 7A) in the ESC. This way, heat can be uniformly transferred from the ESC to the substrate, and a uniform temperature can be maintained across the substrate according to a temperature profile determined for the recipe used to the process the substrate.

Thus, the systems and methods of the present disclosure can detect temperature or heat flux non-uniformities due to actual ESC non-uniformities as well as RF induced non-uniformities, and can compensate for the non-uniformities by tuning one or more of RF power, gas supply, heater power, and TCU settings.

Notably, the systems and methods of the present disclosure use self-referencing procedures to sense the various non-uniformities. That is, a reference temperature is not used in any of the methods described above. Instead, a temperature change rather than actual temperature is used. Accordingly, these methods significantly simplify the complex calibration procedures that are typically used to sense these non-uniformities. The complexities of these calibration procedures is exacerbated due to the fact that the calibrating tools used in these calibration procedures also need to be calibrated. The systems and methods of the present disclosure eliminate these issues. Furthermore, due to the self-referencing process used by the systems and methods of the present disclosure, chamber-to-chamber matching, which is typically a complex task, can be easily achieved.

Figure 9B:
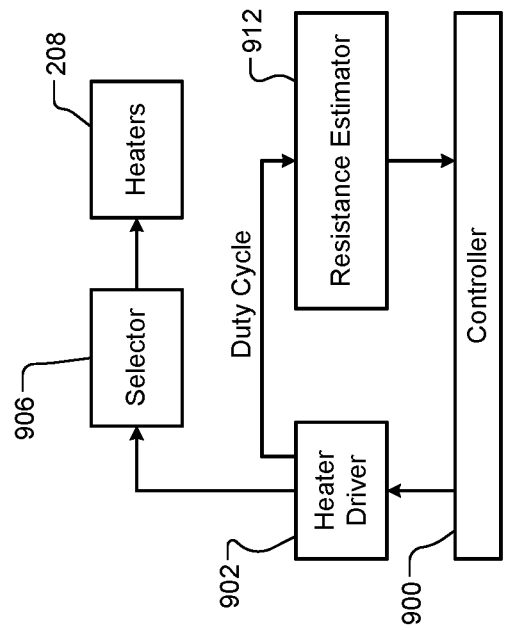
FIGS. 9A and 9B show functional block diagrams of examples of heating systems according to the present disclosure.
Figure 9A:
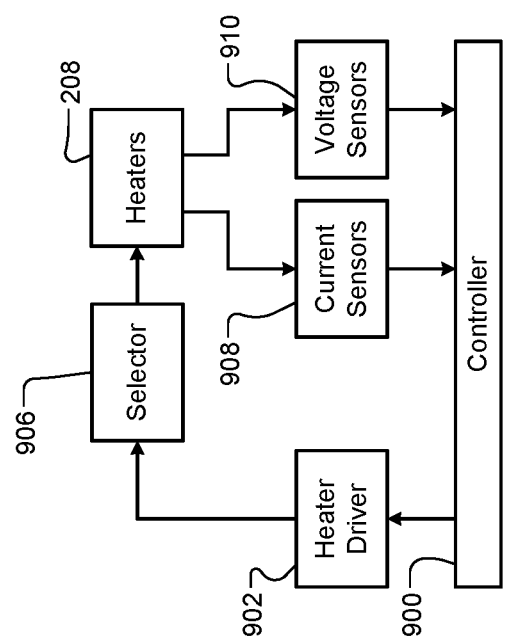

FIGS. 9A and 9B show a controller 900 that may be used to control the multi-zone heaters 502 and the matrix heaters 402 (collectively the heaters 208) and to sense and compensate the various non-uniformities by executing the methods of FIGS. 6-8. For example, the controller 900 shown in FIGS. 9A and 9B may be implemented by the controller 54 shown in FIG. 1. Other elements shown in FIGS. 9A and 9B except the heaters 208 may be implemented by element 212 shown in FIG. 2, the controller 54 shown in FIG. 1, or a combination thereof.

In FIG. 9A, a heater driver 902 may be used to supply power to the heaters 208 selected by a selector 906 under the control of the controller 900. For example, the heater driver 902 may include the heater power supply 214 shown in FIG. 2. For example, the heaters 208 may include the multi-zone heaters 502 and the matrix heaters 402. Current sensors 908 may be used to sense current supplied to the heaters 208 by the heater driver 902. Voltage sensors 910 may be used to sense voltage supplied to the heaters 208 by the heater driver 902. The controller 900 determines the resistance of each of the heaters 208 based on the respective current and/or voltage measurements from the current sensors 908 and/or the voltage sensors 910.

FIG. 9B shows that the controller 900 uses a resistance estimator 912 to monitor duty cycles of the heaters 208 and to estimate the resistance of the heaters 208 based on the corresponding duty cycle. In this example, it is assumed that the voltage or current is a constant value, and the duty cycle of the current or voltage is varied. In other words, the controller 900 estimates resistance based on the known voltage or current and the duty cycle for the current or voltage. Accordingly, in this example, the current sensors 908 and the voltage sensors 910 are omitted.

The method 600, 700 or 800 can be applied prior to processing every single wafer or prior to processing a plurality of wafers. The selection on when to apply the method 600, 700 or 800 is based on the tradeoff of wafer processing throughput and real-time non-uniformity compensation performances. The method 600, 700 or 800 takes some time to complete. A customer may want most of the tool time spent on the actual wafer processing to have greater throughput (which is more profitable), and may therefore prefer fewer applications of the method 600, 700 or 800. If the customer's recipes are not too sensitive to the non-uniformity or if some of the non-uniformity contributors do not shift, then it is meaningful to apply the method 600, 700 or 800 less frequently. Otherwise the customer will have to apply the method 600, 700 or 800 more frequently such that the finished wafers are not impacted by the non-uniformity shifts. This tradeoff can be determined during recipe development.

Further, in the method 600 or 800, the procedure 604 through 608 or 804 through 808 may not be performed if the matrix heaters' own non-uniformity is constant. During tool qualification, two sets of measurements (e.g., voltages/currents) of the matrix heaters' operation are taken within a particular time interval. If the two sets of measurements indicate no difference statistically, then the matrix heaters' non-uniformity can be presumed to be constant.

Instead of measuring the matrix heaters' resistances by measuring the current through and voltage across, direct temperature sensors can be placed in each heater of the matrix heaters and the temperature readings can be used in the method 600, 700 or 800, although direct sensing of matrix heaters' temperature is not practical.

The systems and methods of the present disclosure provide a way to measure plasma uniformity, in situ, real-time, close to wafer, without adding any additional hardware/cost. The existing methods are either non real-time, have poor resolution, or expensive. The plasma uniformity measurement made using the systems and methods of the present disclosure can be used for performing health check of substrate processing systems. Further, closed-loop real-time compensation for plasma non-uniformity is made possible by the systems and methods of the present disclosure. Such real-time compensation improves chamber-to-chamber and wafer-to-wafer matching and wafer yield.

Further, the systems and methods of the present disclosure account for many other contributors to wafer thermal non-uniformity such as ESC multi-zone heater controls, gas injections, and etc. Real-time compensation of these contributors relaxes the manufacturing processes of various sub-assemblies of the substrate processing systems, thus reducing overall system cost. The systems and methods provide engineers (e.g., RF engineers, gas delivery engineers, ESC engineers, and so on) direct data to improve designs of respective subassemblies and thus provide substrate processing systems with overall improved performance.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate.

The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

The program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
   a substrate support configured to support a semiconductor substrate in a processing chamber;
   a matrix heater arranged in the substrate support, the matrix heater including a plurality of heater elements arranged in a matrix and configured to control a temperature of the semiconductor substrate during processing;
   a gas source configured to supply a process gas to the processing chamber;
   an RF generator configured to supply RF power to the processing chamber to generate plasma in the processing chamber;
   a power source configured to supply power to the plurality of heater elements of the matrix heater; and
   a controller configured to, while supplying a predetermined power to the plurality of heater elements of the matrix heater:
      supply the process gas and the RF power to generate the plasma;
      determine first resistances of the plurality of heater elements;
      vary one parameter selected from a group consisting of a chemistry of the process gas, a flow rate of the process gas, and the RF power to continue generating the plasma while keeping the other parameters from the group fixed;
      determine second resistances of the plurality of heater elements in response to varying the one parameter; and
      determine uniformity of the plasma based on the first and second resistances of the plurality of heater elements.

2. The substrate processing system of claim 1 wherein the controller is configured to:
   prior to turning on the gas source and the RF generator:
      determine a heating response of the plurality of heater elements by supplying power to the plurality of heater elements; increase the power to the plurality of heater elements in N increments up to the predetermined power, where N is an integer greater than 1; and
      determine resistances of the plurality of heater elements after each increment; and
   after determining the heating response of the plurality of heater elements, determine the uniformity of the plasma based on the heating response and the first and second resistances of the plurality of heater elements.

3. The substrate processing system of claim 2 wherein the controller is configured to:
   determine a temperature distribution across the plurality of heater elements based on the heating response and the first and second resistances of the plurality of heater elements; and
   determine the uniformity of the plasma based on the temperature distribution across the plurality of heater elements.

4. The substrate processing system of claim 1 wherein in response to the plasma being non-uniform, the controller is configured to adjust one or more of the following during the processing of the semiconductor substrate to compensate for the non-uniformity of the plasma:
   the RF power;
   the chemistry of the process gas;
   the flow rate of the process gas;
   the power supplied to one or more of the plurality of heater elements;
   a temperature of a coolant supplied by a thermal control unit to the substrate support; and
   a rate of flow of the coolant supplied by the thermal control unit to the substrate support.

5. A substrate processing system comprising:
   a substrate support configured to support a semiconductor substrate in a processing chamber, wherein the substrate support comprises:
      a first heater configured to heat a region of the substrate support adjacent to the semiconductor substrate during processing of the semiconductor substrate; and
      a second heater vertically separated from the first heater, the second heater comprising heater elements arranged in a matrix and configured to control a temperature of the semiconductor substrate during processing;
   a gas source configured to supply a process gas to the processing chamber;
   an RF generator configured to supply RF power to the processing chamber to generate plasma in the processing chamber; and
   a controller configured to:
      supply the process gas and the RF power to generate the plasma;
      determine a first resistance of the first heater indicating a first temperature of the first heater,
      determine a second resistance of one of the heater elements of the second heater indicating a second temperature of the one of the heater elements;
      determine a heat flux between the first heater and the one of the heater elements based on a difference between the first and the second temperatures; and
      determine uniformity of the plasma based on the heat flux.

6. The substrate processing system of claim 5 wherein in response to the plasma being non-uniform, the controller is configured to adjust one or more of the following during the processing of the semiconductor substrate to compensate for the non-uniformity of the plasma:
   the RF power;
   a chemistry of the process gas;
   a flow rate of the process gas;
   a power supplied to one or more of the heater elements;
   a temperature of a coolant supplied by a thermal control unit to the substrate support; and
   a rate of flow of the coolant supplied by the thermal control unit to the substrate support.

7. A substrate processing system comprising:
   a substrate support configured to support a semiconductor substrate in a processing chamber, wherein the substrate support comprises:
      a first heater configured to heat a region of the substrate support adjacent to the semiconductor substrate during processing of the semiconductor substrate; and
      a second heater comprising heater elements arranged in a matrix and configured to control a temperature of the semiconductor substrate during processing;
   a power source configured to supply power to the first and second heaters; and
   a controller configured to, while supplying a predetermined power to the heater elements of the second heater:
      supply a first amount of power to the first heater;
      determine first resistances of the heater elements;
      supply a second amount of power to the first heater;

determine second resistances of the heater elements; and determine a non-uniformity of the substrate support based on the first and second resistances of the heater elements.

8. The substrate processing system of claim 7 further comprising:
a gas source configured to supply a process gas to the processing chamber; and
an RF generator configured to supply RF power to the processing chamber to generate plasma in the processing chamber,
wherein the controller is configured to turn off the gas source and the RF generator prior to supplying power to the first and second heaters until determining the non-uniformity of the substrate support.

9. The substrate processing system of claim 7 wherein the controller is configured to:
prior to supplying the first amount of power to the first heater:
supply power to the heater elements of the second heater;
increase the power to the heater elements in N increments up to the predetermined power, where N is an integer greater than 1;
determine resistances of the heater elements after each increment; and
determine a heating response of the heater elements based on the resistances of the heater elements determined after each increment; and
after determining the heating response of the heater elements, determine the non-uniformity of the substrate support based on the heating response and the first and second resistances of the heater elements.

10. The substrate processing system of claim 9 wherein the controller is configured to:
determine a temperature distribution across the heater elements of the second heater based on the heating response and the first and second resistances of the heater elements; and
determine the non-uniformity of the substrate support based on the temperature distribution across the heater elements.

11. The substrate processing system of claim 7 wherein the controller is configured to adjust one or more of the following during the processing of the semiconductor substrate to compensate for the non-uniformity of the substrate support:
RF power supplied to generate plasma in the processing chamber;
a chemistry of a process gas supplied to generate the plasma in the processing chamber;
a flow rate of the process gas;
the power supplied to one or more of the heater elements;
a temperature of a coolant supplied by a thermal control unit to the substrate support; and
a rate of flow of the coolant supplied by the thermal control unit to the substrate support.

12. A system comprising:
a processor; and
a memory storing instructions which when executed by the processor configure the processor to:
turn off supply of a process gas and RF power to a processing chamber comprising a substrate support to support a semiconductor substrate;
supply power to a plurality of heater elements arranged in a matrix in the substrate support to control a temperature of the semiconductor substrate during processing;
increase the power to the heater elements in N increments up to a predetermined power, where N is an integer greater than 1;
determine resistances of the heater elements after each increment;
determine a heating response of the heater elements based on the resistances;
while supplying the predetermined power to the heater elements;
supply the process gas and the RF power to generate plasma in the processing chamber;
determine first resistances of the heater elements;
vary one parameter selected from a group consisting of a chemistry of the process gas, a flow rate of the process gas, and the RF power to continue generating the plasma while keeping the other parameters from the group fixed;
determine second resistances of the heater elements in response to varying the one parameter;
determine a temperature distribution across the heater elements based on the heating response and the first and second resistances of the heater elements; and
determine uniformity of the plasma based on the temperature distribution across the heater elements.

13. The system of claim 12 wherein in response to the plasma being non-uniform, the instructions further configure the processor to adjust one or more of the following during the processing of the semiconductor substrate to compensate for the non-uniformity of the plasma:
the RF power;
the chemistry of the process gas;
the flow rate of the process gas;
the power supplied to one or more of the heater elements;
a temperature of a coolant supplied by a thermal control unit to the substrate support; and
a rate of flow of the coolant supplied by the thermal control unit to the substrate support.

14. A system comprising:
a processor; and
a memory storing instructions which when executed by the processor configure the processor to:
supply a process gas and RF power to a processing chamber to generate plasma in the processing chamber comprising a substrate support to support a semiconductor substrate during processing of the semiconductor substrate;
determine a first resistance of a first heater arranged in the substrate support to heat a region of the substrate support adjacent to the semiconductor substrate during processing of the semiconductor substrate, the first resistance indicating a first temperature of the first heater;
determine a second resistance of one of a plurality of heater elements arranged in a matrix in the substrate support to control a temperature of the semiconductor substrate during processing, the second resistance indicating a second temperature of the one of the heater elements; and
determine a heat flux between the first heater and the one of the heater elements based on a difference between the first and the second temperatures; and
determine uniformity of the plasma based on the heat flux.

15. The system of claim 14 wherein in response to the plasma being non-uniform, the instructions further configure the processor to adjust one or more of the following during the processing of the semiconductor substrate to compensate for the non-uniformity of the plasma:
- the RF power;
- a chemistry of the process gas;
- a flow rate of the process gas;
- a power supplied to one or more of the heater elements;
- a temperature of a coolant supplied by a thermal control unit to the substrate support; and
- a rate of flow of the coolant supplied by the thermal control unit to the substrate support.

16. A system comprising:
a processor; and
a memory storing instructions which when executed by the processor configure the processor to:
- turn off power supply to a first heater arranged in a substrate support to heat a region of the substrate support adjacent to a semiconductor substrate arranged on the substrate support during processing of the semiconductor substrate in a processing chamber;
- turn off supply of a process gas and RF power to the processing chamber;
- supply power to a plurality of heater elements arranged in a matrix in the substrate support to control a temperature of the semiconductor substrate during processing;
- increase the power to the heater elements in N increments up to a predetermined power, where N is an integer greater than 1;
- determine resistances of the heater elements after each increment;
- determine a heating response of the heater elements based on the resistances;
- while supplying the predetermined power to the heater elements:
  - supply a first amount of power to the first heater;
  - determine first resistances of the heater elements;
  - supply a second amount of power to the first heater;
  - determine second resistances of the heater elements;
  - determine a temperature distribution across the heater elements based on the heating response and the first and second resistances of the heater elements; and
  - determine the non-uniformity of the substrate support based on the temperature distribution across the heater elements.

17. The system of claim 16 wherein the instructions further configure the processor to adjust one or more of the following during the processing of the semiconductor substrate to compensate for the non-uniformity of the substrate support:
- the RF power supplied to generate plasma in the processing chamber;
- a chemistry of the process gas supplied to generate the plasma in the processing chamber;
- a flow rate of the process gas;
- the power supplied to one or more of the heater elements;
- a temperature of a coolant supplied by a thermal control unit to the substrate support; and
- a rate of flow of the coolant supplied by the thermal control unit to the substrate support.

* * * * *